United States Patent
Miya et al.

(10) Patent No.: US 9,922,848 B2
(45) Date of Patent: Mar. 20, 2018

(54) APPARATUS FOR AND METHOD OF PROCESSING SUBSTRATE

(71) Applicants: Katsuhiko Miya, Kyoto (JP); Hiroaki Kitagawa, Kyoto (JP)

(72) Inventors: Katsuhiko Miya, Kyoto (JP); Hiroaki Kitagawa, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 369 days.

(21) Appl. No.: 14/716,980

(22) Filed: May 20, 2015

(65) Prior Publication Data

US 2015/0255315 A1    Sep. 10, 2015

Related U.S. Application Data

(62) Division of application No. 13/070,786, filed on Mar. 24, 2011.

(30) Foreign Application Priority Data

Sep. 29, 2010 (JP) .................................. 2010-218669

(51) Int. Cl.
*H01L 21/00* (2006.01)
*H01L 21/67* (2006.01)
*B08B 7/00* (2006.01)

(52) U.S. Cl.
CPC ...... *H01L 21/67028* (2013.01); *B08B 7/0014* (2013.01); *H01L 21/67034* (2013.01)

(58) Field of Classification Search
CPC ............... B08B 7/0021; Y10S 134/902; H01L 21/67034; H01L 21/02052; H01L 21/02057

(Continued)

(56) References Cited

U.S. PATENT DOCUMENTS 5,908,510 A * 6/1999 McCullough ......... B08B 7/0021
                                                          134/2
6,451,375 B1 * 9/2002 Cotte ....................... B05D 1/18
                                                          427/123

(Continued)

FOREIGN PATENT DOCUMENTS

JP    02-010832    1/1990
JP    04-242930    8/1992

(Continued)

OTHER PUBLICATIONS

Yahagi et al., "Substrate Drying Method" Nov. 1992, JP 04-331956—Machine Translation.*

(Continued)

*Primary Examiner* — David G Cormier
*Assistant Examiner* — Thomas Bucci
(74) *Attorney, Agent, or Firm* — Ostrolenk Faber LLP

(57) ABSTRACT

A rinsing liquid adheres to a substrate subjected to a cleaning process. The rinsing liquid on the substrate is first replaced with IPA liquid. While the substrate covered with the IPA liquid is held in a dryer chamber, liquid carbon dioxide is supplied to the surface of the substrate. Liquid nitrogen is supplied to cool down the interior of the dryer chamber. This solidifies the liquid carbon dioxide on the substrate into solid carbon dioxide. Thereafter, the pressure in the dryer chamber is returned to atmospheric pressure, and gaseous nitrogen is supplied into the dryer chamber. Thus, the temperature in the dryer chamber increases. The solid carbon dioxide on the surface of the substrate is sublimated, and is hence removed from the substrate. All of the steps are performed while carbon dioxide is not in a supercritical state but in a non-supercritical state.

13 Claims, 10 Drawing Sheets

(58) Field of Classification Search
USPC ..... 134/4, 30, 26, 902, 36, 34, 2, 1, 1.3, 42, 134/31, 3, 105, 19, 1.1, 21, 41, 5, 6, 95.1; 257/E21.228, E21.255, E21.252, E21.256, 257/E21.224, E21.26, E21.09; 438/745, 438/689, 692, 693, 706, 690, 734, 906
See application file for complete search history.

(56) References Cited

U.S. PATENT DOCUMENTS

| | | | | |
|---|---|---|---|---|
| 6,531,401 | B2* | 3/2003 | Moore | B08B 1/00 134/5 |
| 6,541,278 | B2* | 4/2003 | Morita | C23C 16/409 216/37 |
| 7,942,976 | B2 | 5/2011 | Miya et al. | |
| 8,029,622 | B2 | 10/2011 | Miya et al. | |
| 2003/0051741 | A1* | 3/2003 | DeSimone | B08B 7/0021 134/21 |
| 2003/0188766 | A1* | 10/2003 | Banerjee | B08B 3/04 134/7 |
| 2004/0112406 | A1* | 6/2004 | Cotte | B08B 7/0021 134/4 |
| 2005/0051194 | A1 | 3/2005 | Sakashita et al. | |
| 2005/0199263 | A1* | 9/2005 | Irie | B08B 7/0021 134/2 |
| 2005/0205110 | A1* | 9/2005 | Kao | H01J 37/32082 134/1.1 |
| 2007/0134927 | A1* | 6/2007 | Fortin | B08B 3/08 438/725 |
| 2008/0060686 | A1* | 3/2008 | Miya | B08B 7/0014 134/37 |
| 2010/0072169 | A1 | 3/2010 | DeYoung et al. | |
| 2010/0206337 | A1 | 8/2010 | Hiroshiro et al. | |

FOREIGN PATENT DOCUMENTS

| | | | |
|---|---|---|---|
| JP | 04242930 | A * | 8/1992 |
| JP | 04-331956 | | 11/1992 |
| JP | 04331956 | A * | 11/1992 |
| JP | 05-267269 | | 10/1993 |
| JP | 10-135180 | | 5/1998 |
| JP | 11-294948 | | 10/1999 |
| JP | 11-354486 | | 12/1999 |
| JP | 2005-064269 | | 3/2005 |
| JP | 2008-072118 | | 3/2008 |
| JP | 2008-130952 | | 6/2008 |
| JP | 2009-038282 | | 2/2009 |
| JP | 2010-199261 | | 9/2010 |
| JP | 2012-503883 | | 2/2012 |
| TW | 2008-16298 | | 4/2008 |
| TW | 2008-26171 | | 6/2008 |
| TW | 2009-08105 | | 2/2009 |
| WO | WO 2010/036575 | | 4/2010 |

OTHER PUBLICATIONS

Shiraishi et al., "Method for Drying Object to be Treated" Aug. 1992, JP 04-242930—Machine Translation.*
Office Action issued by Japanese Patent Office dated Mar. 18, 2014 in connection with corresponding Japanese Patent Application No. 2010-218669 with English Translation thereof.
Notice of Allowance issued by Japanese Patent Office dated Nov. 4, 2014 in connection with corresponding Japanese Patent Application No. 2010-218669.
Office Action issued by Taiwanese Patent Office dated Aug. 28, 2013 in connection with corresponding Taiwan Patent Application No. 100105518 with Japanese and English Translation thereof.

* cited by examiner

F I G . 1
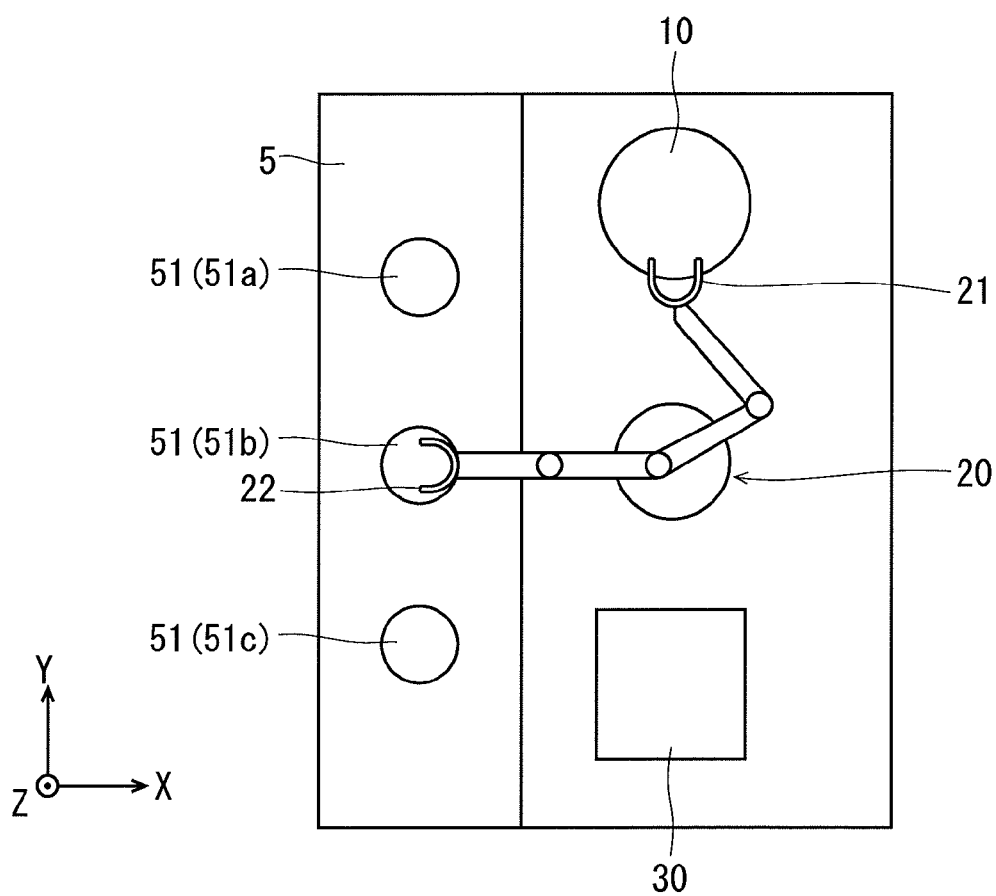

F I G . 2
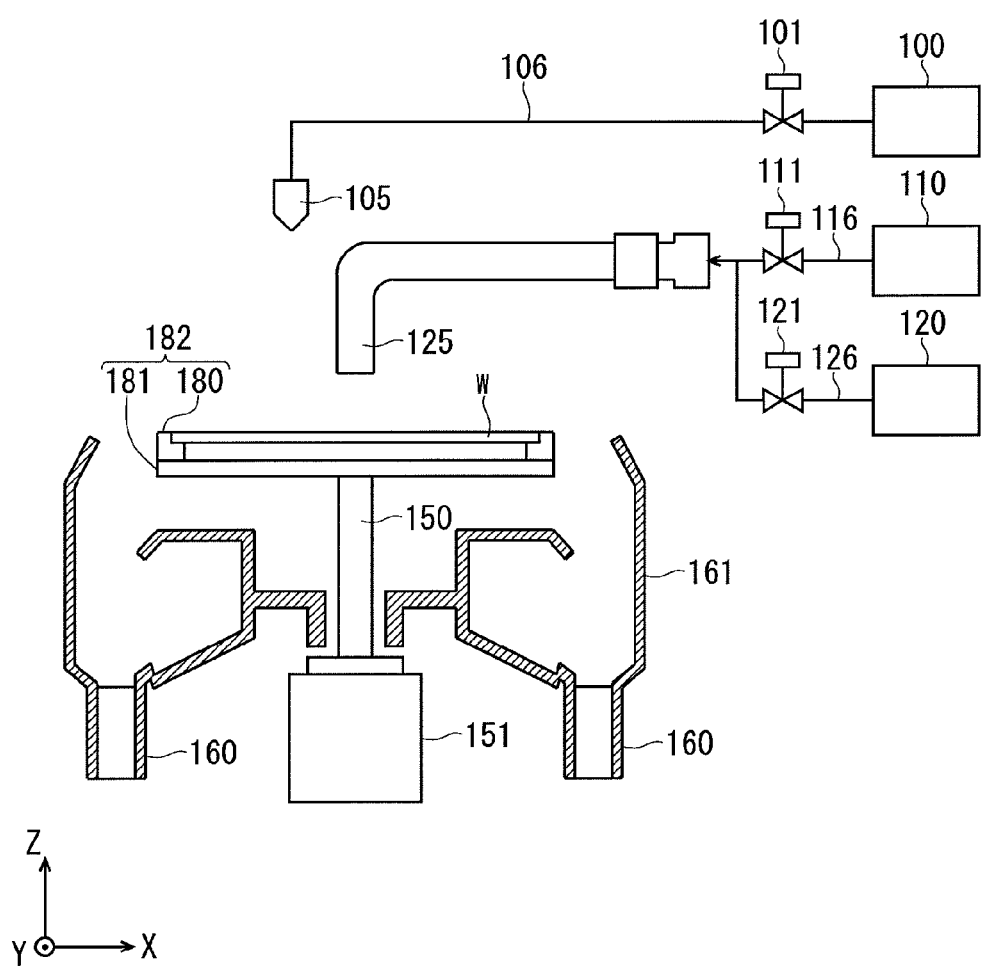

F I G . 4
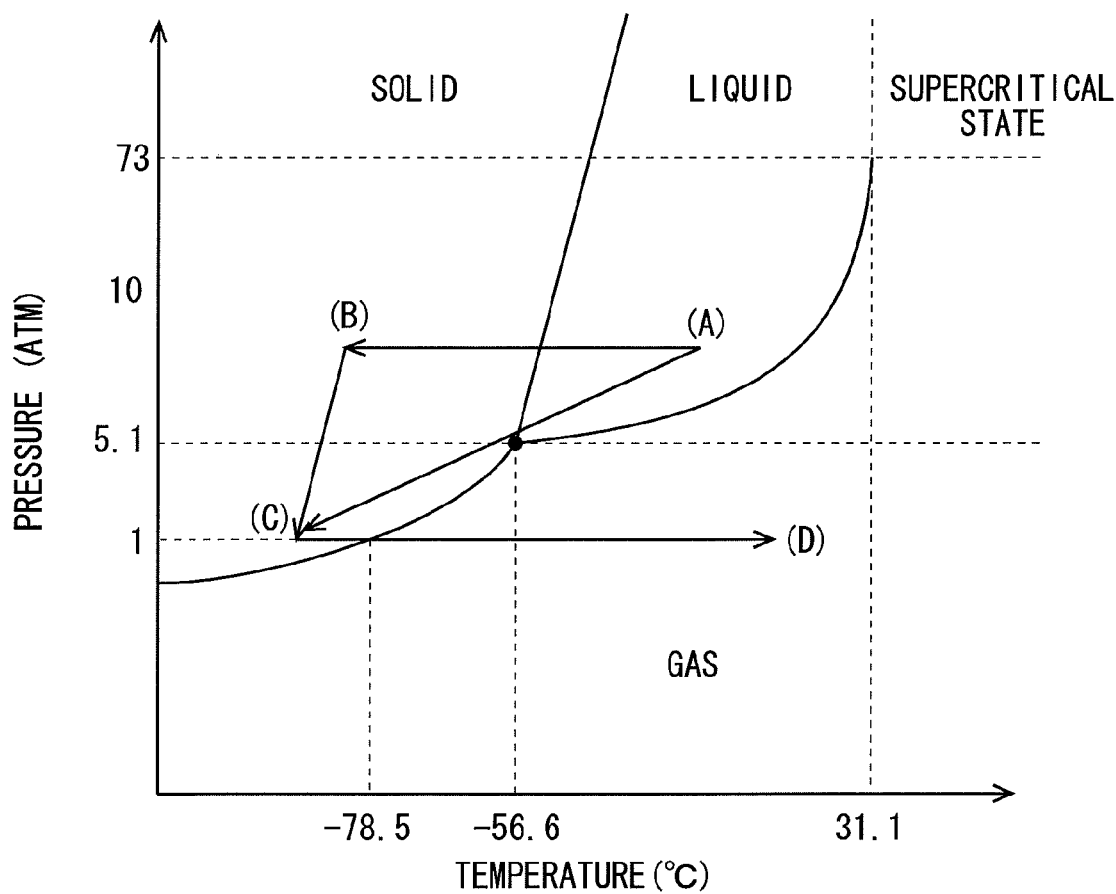

F I G . 5
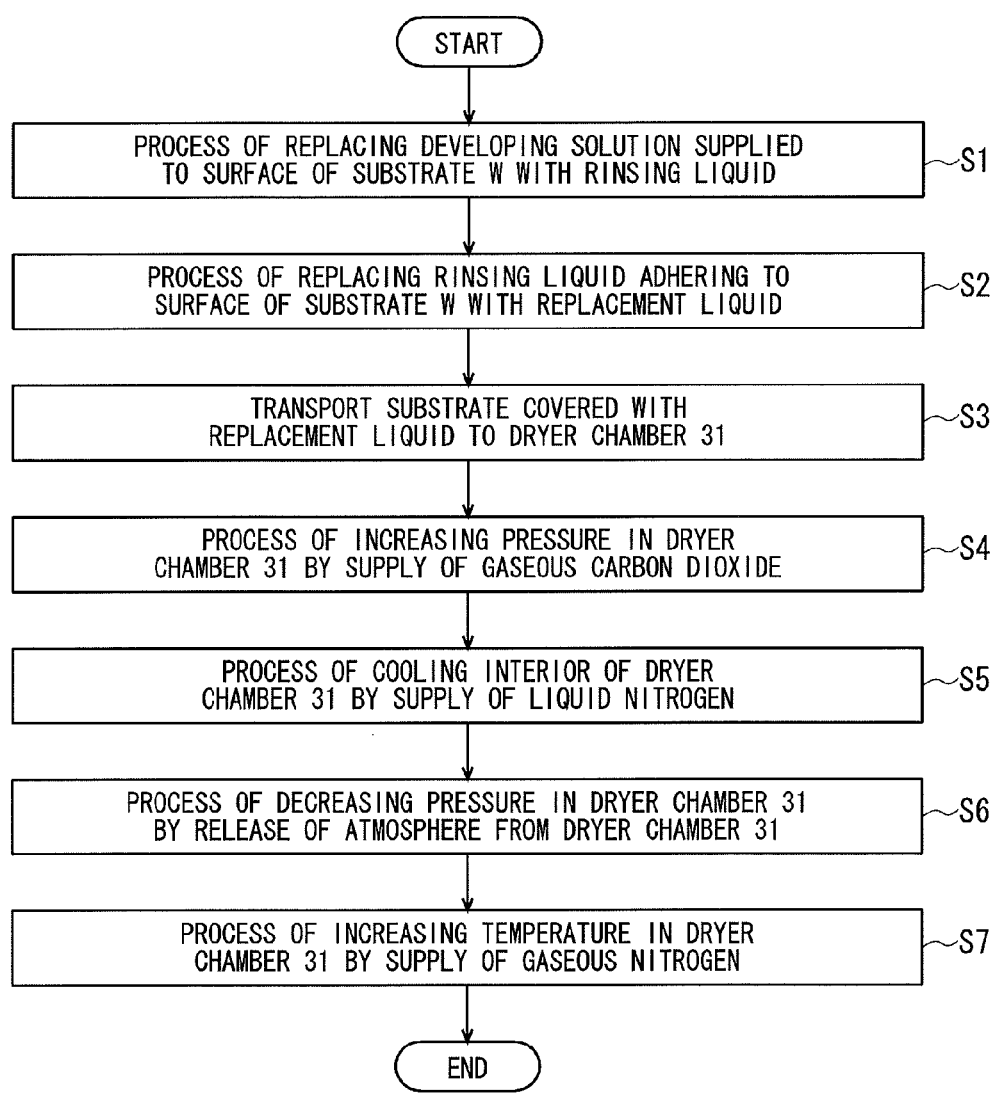

F I G . 1 2
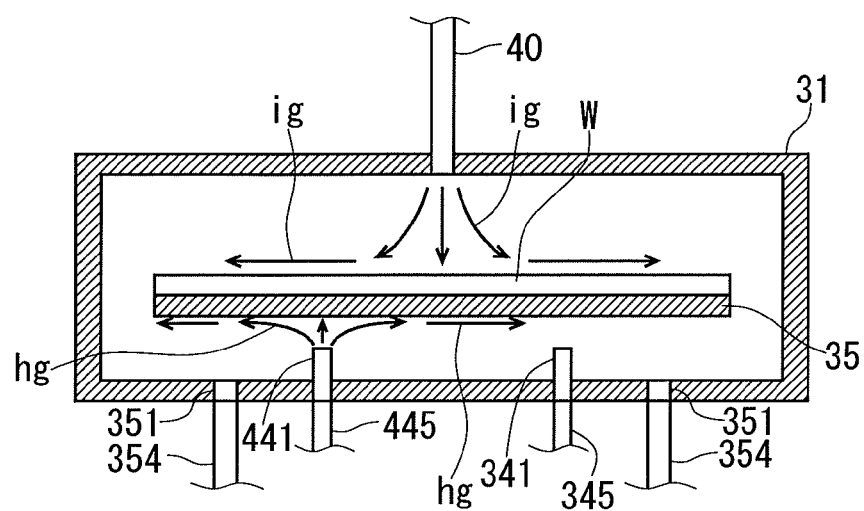

APPARATUS FOR AND METHOD OF PROCESSING SUBSTRATE

CROSS REFERENCE TO RELATED APPLICATIONS

The present application is a divisional under 37 C.F.R. § 1.53(b) of prior application Ser. No. 13/070,786, filed Mar. 24, 2011, by Katsuhiko MIYA et al., entitled APPARATUS FOR AND METHOD OF PROCESSING SUBSTRATE, which claims the benefit of Japanese Appln. S.N. JP2010-218669 filed Sep. 29, 2010, the contents of which are incorporated by this reference.

BACKGROUND OF THE INVENTION

Field of the Invention

The present invention relates to a substrate processing apparatus and a substrate processing method which remove liquid adhering to various substrates (referred to simply as "substrates" hereinafter) including a semiconductor substrate, a glass substrate for a flat panel display, a substrate for an optical disk, a solar cell panel and the like from the substrates.

Description of the Background Art

In the process steps of manufacturing a semiconductor device, for example, a variety of wet processes using liquid are performed on a substrate, and a drying process is then performed on the substrate subjected to such wet processes. In the process of development in photolithography, a chemical liquid such as a developing solution is applied to a substrate to which a pattern is transferred by exposure to light, and thereafter the substrate is cleaned using a rinsing liquid to remove the chemical liquid from the substrate. The rinsing liquid is replaced with a replacement liquid such as isopropyl alcohol (IPA), and the substrate is dried by removing the replacement liquid.

In recent years, however, there has been a tendency for patterns formed on substrate surfaces to become finer. This gives rise to a problem such that, in the drying process of the replacement liquid, surface tension (or capillary force) acting on a boundary surface between the liquid entering the microstructure of a pattern and a gas in contact with the liquid causes adjacent protruding portions of the pattern to attract each other, thereby collapsing the adjacent protruding portions.

To prevent the collapse of the pattern resulting from such capillary force, there has been a known substrate drying technique using a supercritical fluid. The supercritical fluid is low in viscosity, high in diffusibility, and has no surface tension. There is hence no apprehension that the supercritical fluid brings about the collapse of the pattern when supplied to the substrate. Japanese Patent Application Laid-Open No. 2008-072118 discloses a technique in which carbon dioxide in a supercritical state is supplied to a pattern formed on the surface of a substrate and is then vaporized, whereby the surface of the substrate is dried.

As disclosed in Japanese Patent Application Laid-Open No. 2008-072118, carbon dioxide is relatively easily brought into the supercritical state. However, a high-pressure environment having a pressure as high as 73 atmospheres or more must be set to achieve the supercritical state. Thus, the setting of such an environment in which the supercritical state is achievable necessitates an apparatus for achieving and maintaining a high-pressure state. The provision of such an apparatus requires apparatus costs. These problems become considerations not only in the process of drying the substrate by the removal of the replacement liquid but also in the general processes of removing liquid remaining on the substrate from the substrate.

SUMMARY OF THE INVENTION

The present invention is intended for a substrate processing apparatus and a substrate processing method which are capable of drying a substrate without collapsing a pattern provided on the substrate in an environment with a pressure lower than that required to achieve a supercritical state.

According to a first aspect of the present invention, a substrate processing apparatus for removing a first liquid from a substrate with the first liquid adhering thereto comprises: a process chamber for receiving the substrate therein; a liquid supply part for supplying a second liquid made of a predetermined material different from that of the first liquid to the substrate received in the process chamber, with the first liquid adhering to the substrate; a solidifying part for solidifying the predetermined material on the substrate; and a removing part for changing at least one of temperature and pressure in the process chamber to sublimate the solidified predetermined material, thereby removing the predetermined material from the substrate.

According to a second aspect of the present invention, a method of processing a substrate to remove a first liquid from the substrate with the first liquid adhering thereto comprises the steps of: (a) adjusting an atmosphere surrounding the substrate with the first liquid adhering thereto to an atmosphere having temperature and pressure higher than the temperature and pressure of a predetermined material at the triple point thereof; (b) supplying a second liquid made of the predetermined material to the substrate; (c) solidifying the predetermined material on the substrate; and (d) changing at least one of the temperature and pressure in the process chamber to sublimate the solidified predetermined material, thereby removing the predetermined material from the substrate.

According to the present invention, the predetermined material is supplied in a liquid phase onto the substrate, and is then solidified. Thereafter, the predetermined material in a solid phase is sublimated, and is hence removed from the substrate. Thus, capillary force does not act on the substrate. This prevents damages to a pattern provided on the substrate. Also, for the solidification of a material, it is in general sufficient to use a pressure lower than that required to place the material into a supercritical state. The present invention therefore eliminates the need to provide facilities for achieving a high-pressure environment, thereby reducing apparatus costs.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a top plan view of a substrate processing apparatus according to a first preferred embodiment of the present invention;

FIG. 2 is a sectional view of a developer unit taken along a plane defined by X- and Z-axes according to the first preferred embodiment of the present invention;

FIG. 4 is a phase diagram of carbon dioxide showing changes in temperature and pressure in procedures according to the first preferred embodiment and a second preferred embodiment of the present invention;

FIG. 5 is a flow diagram showing the procedure according to the first preferred embodiment of the present invention;

FIGS. 6 to 12 are schematic views partly showing the procedure according to the first preferred embodiment of the present invention;

DESCRIPTION OF THE PREFERRED EMBODIMENTS

Figure 3:
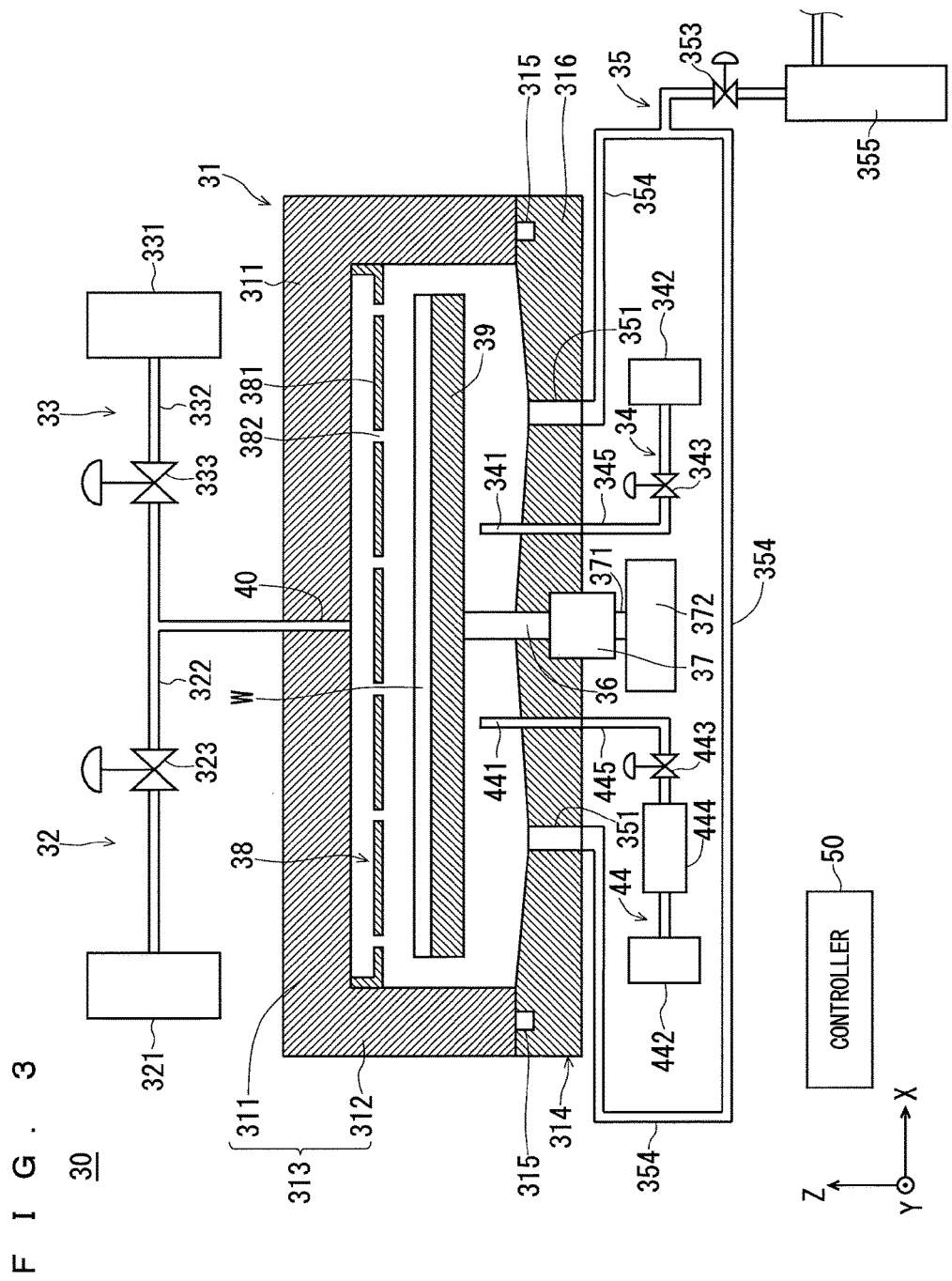
FIG. 3 is a sectional view of a dryer unit taken along a plane defined by X- and Z-axes according to the first preferred embodiment of the present invention.

Preferred embodiments according to the present invention will now be described with reference to the accompanying drawings. The preferred embodiments to be described below are examples embodying the present invention, and do not limit the technical scope of the present invention.

First Preferred Embodiment

A substrate processing apparatus 1 as shown in FIG. 1 is a system of process units which is used, for example, in the course of a developing process of a semiconductor substrate W for use as a material of a semiconductor device, and which performs a cleaning process and a drying process after the developing process. The substrate processing apparatus 1 principally includes a substrate station 5, a transfer unit 20, a developer unit 10, and a dryer unit 30. The substrate processing apparatus 1 to be described below is configured as, but not limited to, a single-substrate type processing system for serially processing wafers or substrates W, and may be configured as a batch-type processing system.

The substrate station 5 includes a plurality of cassettes 51 (in this preferred embodiment, three cassettes 51a, 51b and 51c) placed thereon. A partition wall divides the developer unit 10 and the dryer unit 30 from each other. Substrates W subjected to an exposure process are stored in a stacked relation in each of the cassettes 51. The substrates W placed on the substrate station 5 are transported by the transfer unit 20 in sequential order to the developer unit 10 and to the dryer unit 30.

The transfer unit 20 includes a first hand 21, a second hand 22, an extendable and retractable arm capable of pivoting each of the first hand 21 and the second hand 22 about a vertical axis, and a swivelable substrate support (not shown) provided on the distal end of each of the arms. The transport of the substrates W is performed efficiently by the first hand 21 and the second hand 22.

The developer unit 10 shown in FIG. 2 is a device for applying a developing solution to a top major surface of an exposed substrate W, to thereby develop an exposure pattern of a resist layer and the like on the substrate W. The developer unit 10 includes a substrate holder 182 having a substrate support plate 181 of a planar size approximately equal to that of the substrate W, and a plurality of peripheral support pins 180 rigidly secured to the top surface of the substrate support plate 181. The peripheral support pins 180 support the peripheral portion of the substrate W. This allows the substrate W to be held in a substantially horizontal position. The substrate support plate 181 is coupled to a rotary shaft 150 of a motor 151, and rotates as the motor 151 operates.

A chemical liquid supplied to the substrate W in the developer unit 10 is the developing solution. After the developing process using the developing solution is completed, the developing solution is removed by being replaced with a rinsing liquid. Then, the rinsing liquid is replaced with a replacement liquid. The developing solution is stored in a developing solution supply source 100, and is supplied through a slit nozzle 105 onto the top major surface of the substrate W by opening a valve 101 provided in a pipe 106 providing a connection between the developing solution supply source 100 and the slit nozzle 105. This causes the developing solution to spread over the top major surface of the substrate W, thereby forming a developing solution layer. In this manner, the developing solution in the form of a puddle is held on the top major surface of the substrate W for a predetermined length of time. In general, an alkaline aqueous solution is used as the developing solution. However, an organic developing solution such as butyl acetate may be used, depending on the type of a photoresist.

A discharge nozzle 125 provided over the substrate holder 182 is used in common for the rinsing liquid and the replacement liquid. Specifically, the discharge nozzle 125 is coupled through a pipe 116 to a rinsing liquid supply source 110, and is also coupled through a pipe 126 to a replacement liquid supply source 120. A valve 111 is provided in the pipe 116, and a valve 121 is provided in the pipe 126. Switching between the opening and closing of the valves 111 and 121 permits the selective discharge of the rinsing liquid or the replacement liquid from the discharge nozzle 125. It should be noted that the rinsing liquid and the replacement liquid may be discharged from respective separate discharge nozzles.

When the developing solution is an alkaline aqueous solution, deionized water (DIW) is in general used as the rinsing liquid. When the developing solution is an organic developing solution, on the other hand, isopropyl alcohol (IPA) or the like is used as the rinsing liquid. The replacement liquid used in this preferred embodiment is a liquid having the physical property of having a solidification temperature lower than that of the rinsing liquid. For example, when the rinsing liquid is DIW, IPA liquid is used as the replacement liquid. In this preferred embodiment, DIW is used as the rinsing liquid, and IPA liquid is used as the replacement liquid.

A processing cup 161 is provided around the substrate holder 182 to collect a surplus of the alkaline aqueous solution that is the developing solution supplied through the slit nozzle 105 onto the substrate W, DIW that is the rinsing liquid supplied through the discharge nozzle 125, and IPA liquid that is the replacement liquid supplied through the discharge nozzle 125. These collected chemical liquids are drained through drain outlets 160 to the outside of the developer unit 10.

The dryer unit 30 according to the first preferred embodiment as shown in FIG. 3 is a device for performing the drying process on a substrate W subjected to the developing process in the developer unit 10. The dryer unit 30 principally includes a dryer chamber 31, a carbon dioxide supply mechanism 32, a first nitrogen supply mechanism 33, a liquid nitrogen supply mechanism 34, a second nitrogen supply mechanism 44, and a drain mechanism 35.

The dryer chamber (process chamber) 31 includes a cylindrical upper member 313, and a lower member 314 provided with a circular bottom wall 316. The upper member 313 and the lower member 314 are brought into intimate contact with each other by a sealing material 315. The upper member 313 is configured such that a circular top wall 311 and a side wall 312 provided around the top wall 311 are integrated together. The top surface of the bottom wall 316, i.e. a surface of the lower member 314 that defines the interior space of the dryer chamber 31, is inclined from the horizontal. The upper member 313 and the lower member 314 are movable relative to each other in a vertical direction, and come into contact with or separate from each other to thereby allow the dryer chamber 31 to close or open. After a substrate W is transported into the dryer chamber 31 that is left open, the dryer chamber 31 is closed. After the dryer chamber 31 is hermetically closed, the substrate W is subjected to the process in the dryer chamber 31.

A table 39 for placing a substrate W thereon is provided in the dryer chamber 31. The substrate W is held in a substantially horizontal position by being placed on the top surface of the table 39. The top surface of the table 39 has suction holes (not shown) formed therein. The bottom surface of the substrate W placed on the table 39 is attracted by suction to the table 39. This allows the substrate W to be held on the table 39.

A support shaft 36 extends downwardly from the center of the bottom surface of the table 39. The support shaft 36 is inserted through the lower member 314, with a high-pressure seal rotation introducing mechanism 37 provided therebetween. The high-pressure seal rotation introducing mechanism 37 has a rotary shaft 371 connected to a rotating mechanism 372 of the dryer chamber 31. Driving the rotating mechanism 372 rotates the substrate W with the table 35 about the support shaft 36 at any rotational speed.

The carbon dioxide supply mechanism 32 includes a carbon dioxide supply source 321, a valve 323, a pipe 322, and a first inlet pipe 40. The first nitrogen supply mechanism 33 includes a first nitrogen supply source 331, a valve 333, a pipe 332, and the first inlet pipe 40. That is, the first inlet pipe 40 is used in common for the carbon dioxide supply mechanism 32 and the first nitrogen supply mechanism 33.

Carbon dioxide supplied from the carbon dioxide supply source 321 is used as a material for removing remaining IPA liquid from the substrate in accordance with principles to be described later. Such a material used for the removal of liquid from a substrate is in general referred to herein as a "sublimation material."

The first inlet pipe 40 is provided in the top wall 311 of the upper member 313 so as to extend through the top wall 311. Specifically, the first inlet pipe 40 has a first end connected to the interior space of the dryer chamber 31. The first inlet pipe 40 has a second end split into two: one is connected to the carbon dioxide supply source 321, and the other is connected to the first nitrogen supply source 331. In the first preferred embodiment, the first inlet pipe 40 is used in common for the supply of carbon dioxide and nitrogen to the dryer chamber 31. However, the dryer unit 30 may be configured to include inlet pipes separately used for the supply of carbon dioxide and nitrogen, respectively.

The valve 323 is provided in the pipe 322 connecting the carbon dioxide supply source 321 and the first inlet pipe 40 to each other, and the valve 333 is provided in the pipe 332 connecting the first nitrogen supply source 331 and the first inlet pipe 40 to each other. Liquefied carbon dioxide is sealed in the carbon dioxide supply source 321. When the valve 323 is opened with the valve 333 closed, part of the liquefied carbon dioxide changes to a gas, which in turn starts to come through the first inlet pipe 40 into the dryer chamber 31. Since the dryer chamber 31 is hermetically closed, the pressure in the dryer chamber 31 reaches an increased pressure higher than the pressure at which carbon dioxide is condensed by the accumulation of the gaseous carbon dioxide coming into the dryer chamber 31 soon after the gaseous carbon dioxide starts to come into the dryer chamber 31, which will be described later. Thus, carbon dioxide in a vapor phase is supplied into the dryer chamber 31 in a very early stage, and shortly thereafter liquefied carbon dioxide is supplied onto the substrate W. In other words, the early stage of supply of carbon dioxide is a stage in which the pressure in the dryer chamber 31 is increased by carbon dioxide in a vapor phase, and the subsequent stage is a stage in which carbon dioxide in a liquid phase is supplied. In another step, when the valve 333 is opened with the valve 323 closed, nitrogen is supplied into the dryer chamber 31. Alternatively, nitrogen the temperature of which is raised by mounting a heater to the pipe 332 may be supplied into the dryer chamber 31.

The liquid nitrogen supply mechanism 34 includes a second inlet pipe 341, a liquid nitrogen supply source 342, a pipe 345, and a valve 343. The second inlet pipe 341 extends through the bottom wall 316 of the lower member 314 to the interior of the dryer chamber 31. The second inlet pipe 341 has a first end provided within the dryer chamber 31 and positioned under the bottom surface of the table 39. The second inlet pipe 341 has a second end connected to the liquid nitrogen supply source 342. The valve 343 is provided in the pipe 345 connecting the second inlet pipe 341 and the liquid nitrogen supply source 342 to each other. Liquid nitrogen is supplied through the second inlet pipe 341 into the dryer chamber 31 by opening the valve 343.

The second nitrogen supply mechanism 44 is further mounted to the lower member 314. The second nitrogen supply mechanism 44 includes a third inlet pipe 441, a second nitrogen supply source 442, a heater 444, a valve 443, and a pipe 445.

Like the second inlet pipe 341, the third inlet pipe 441 extends through the lower member 314 to the interior of the dryer chamber 31. The third inlet pipe 441 has a first end positioned under the bottom surface of the table 39, like the first end of the second inlet pipe 341. The third inlet pipe 441 has a second end connected to the second nitrogen supply source 442. The heater 444 and the valve 443, which are arranged in ascending order of distance from the second nitrogen supply source 442, are provided in the pipe 445 connecting the third inlet pipe 441 and the second nitrogen supply source 442 to each other. Nitrogen supplied from the second nitrogen supply source 442 is raised in temperature by the heater 444, and is supplied at the raised temperature into the dryer chamber 31 by opening the valve 443. Alternatively, a single nitrogen supply source may be provided for a dual purpose to serve as both the first nitrogen supply source 331 and the second nitrogen supply source 442.

A fluid dispersing mechanism 38 is provided in an upper portion of the interior of the dryer chamber 31. The fluid dispersing mechanism 38 includes a round disk-shaped blocking plate 381 fitted in the dryer chamber 31 and having a large number of communication holes 382 extending vertically through the blocking plate 381.

The drain mechanism 35 includes a plurality of drain pipes 351, a pipe 354, and a valve 353. The drain pipes 351 are provided in a lowermost position of the inclined surface of the lower member 314. Thus, the liquid flowing down from over the substrate W flows along the inclined surface of the lower member 314 into the drain pipes 351, and is then drained through the drain pipes 351 to the outside of the dryer chamber 31. The gas within the dryer chamber 31 is also discharged through the drain pipes 351 to the outside of the dryer chamber 31.

A mixture of liquid and gas discharged from the dryer chamber 31 through the drain pipes 351 is decreased in pressure by passing through the valve 353, and is then separated into liquid and gas in a separating tank 355. After the separation, the gas and liquid are sent to respective predetermined devices for reuse or reprocessing purposes.

A temperature measuring part and a pressure measuring part both not shown are provided within the dryer chamber 31, and are able to measure the temperature and pressure in the dryer chamber 31. A controller 50 adjusts the degree of opening of the valves 323, 333, 343, 443 and 353 in accordance with the temperature and pressure measured with the temperature measuring part and pressure measuring part to adjust the temperature and pressure in the dryer chamber 31. The controller 50 is similar in hardware construction to typical computers.

Next, the principle of processing and a specific procedure according to the first preferred embodiment of the present invention will be described with reference to a phase diagram of carbon dioxide shown in FIG. 4, a flow diagram shown in FIG. 5, and FIGS. 6 to 12. In FIGS. 6 to 12, the construction of the dryer unit 30 is shown schematically for the purpose of facilitating the understanding of the procedure. In fact, the dryer unit 30 shown in FIG. 3 is used for the processing. The ordinate of FIG. 4 is indicated to have a logarithmic scale.

Figure 6:
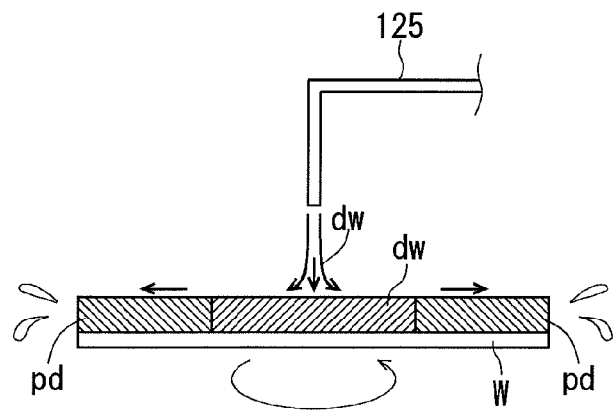

One of the substrates W placed on the substrate station 5 and each having an exposed resist layer is taken out and transported to the developer unit 10 by the transfer unit 20. An alkaline aqueous solution pd serving as the developing solution is supplied to the transported substrate W, whereby the developing process is performed. After a lapse of a predetermined period of time, the supply of the alkaline aqueous solution pd serving as the developing solution is stopped. Then, the valve 111 is opened to supply DIW (dw) serving as the rinsing liquid to the surface of the substrate W, as shown in FIG. 6, for the purpose of removing the alkaline aqueous solution pd remaining on the surface of the substrate W.

During the supply of the DIW (dw), the substrate W is rotating. For this reason, the DIW (dw) supplied to the surface of the substrate W is subjected to centrifugal force to flow over the substrate W toward the outer periphery of the substrate W. Thus, while rinsing the alkaline aqueous solution pd out of the surface of the substrate W, the DIW (dw) splashes with the alkaline aqueous solution pd to the processing cup 161, and is drained through the drain outlets 160. In this manner, the supply of the DIW (dw) serving as the rinsing liquid continues until a lapse of a predetermined period of time, so that the alkaline aqueous solution pd serving as the developing solution and held in the form of a puddle on the surface of the substrate W is replaced with the DIW (dw) (in Step S1).

Figure 7:
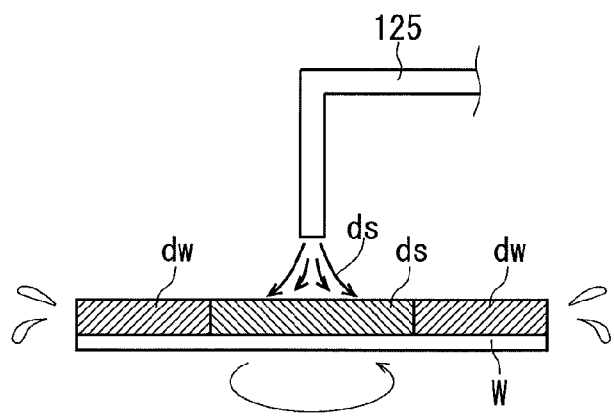

Subsequently, the valve 111 is closed, and the valve 121 is opened to supply IPA liquid ds serving as the replacement liquid through the discharge nozzle 125 onto the substrate W (with reference to FIG. 7). As in the case of the supply of the DIW (dw), the IPA liquid ds rinses the DIW (dw) out of the surface of the substrate W while flowing over the substrate W toward the outer periphery of the substrate W because the substrate W is rotating. Thus, the DIW (dw) remaining on the substrate W is completely replaced with the IPA liquid ds (in Step S2).

After a lapse of a predetermined period of time, the rotation of the substrate W is stopped. Then, the transfer unit 20 takes out the substrate W, and transports the substrate W to the dryer unit 30 (in Step S3). During the transport of the substrate W, the surface of the substrate W is fully covered with the IPA liquid ds serving as the replacement liquid. The dryer chamber 31 of the dryer unit 30 is left open, and the transfer unit 20 places the substrate W onto the table 39.

After the substrate W is placed on the table 39, the upper member 313 and the lower member 314 are fitted together to hermetically close the dryer chamber 31 because all of the valves 323, 333, 343, 443, and 353 are closed. The interior atmosphere (environment) of the dryer chamber 31 in this stage is at normal temperature and pressure.

After the dryer chamber 31 is hermetically closed, the valve 323 is opened. This causes carbon dioxide vaporized upon emission from the carbon dioxide supply source 321, i.e. gaseous carbon dioxide gc, to come through the first inlet pipe 40 into the dryer chamber 31. As the gaseous carbon dioxide gc is supplied, the valve 353 is opened. This causes air in the dryer chamber 31 to exit the dryer chamber 31 through the valve 353, thereby replacing the air in the dryer chamber 31 with the gaseous carbon dioxide gc. After a lapse of a predetermined period of time, the valve 353 is closed, so that the dryer chamber 31 is hermetically closed. The pressure in the dryer chamber 31 increases because the supply of the gaseous carbon dioxide gc into the dryer chamber 31 continues (in Step S4). As the gaseous carbon dioxide gc is supplied into the dryer chamber 31 in this manner, the temperature and pressure in the dryer chamber 31 become higher than a temperature of $-56.6°$ C. and a pressure of 5.1 atmospheres (0.517 MPa) corresponding to the triple point of carbon dioxide. When the pressure in the dryer chamber 31 exceeds a predetermined pressure, the gaseous carbon dioxide gc changes into liquid within the dryer chamber 31. The predetermined pressure is a pressure determined based on a vapor pressure curve representing a relationship between pressure and temperature at which a liquid phase and a vapor phase coexist at the temperature in the dryer chamber 31.

That is, carbon dioxide supplied from the carbon dioxide supply source 321 into the dryer chamber 31 is in the form of a gas at the time of the start of supply of carbon dioxide. Thereafter, as the supply of carbon dioxide continues, the pressure in the dryer chamber 31 increases. When the pressure in the dryer chamber 31 exceeds 5.1 atmospheres to reach a predetermined condensation pressure, carbon dioxide changes into a liquid state. Subsequently, carbon dioxide in such a liquid state is supplied to the substrate W.

Figure 8:
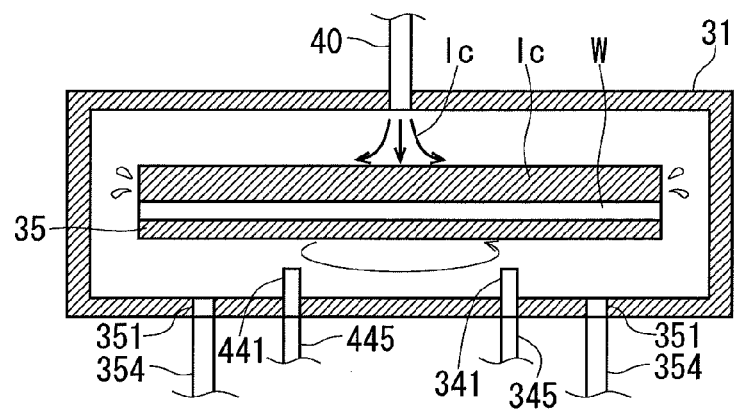

Thus, carbon dioxide is supplied substantially in a liquefied state (liquid carbon dioxide lc) to the dryer chamber 31, as shown in FIG. 8, except for a temporary gaseous state in an early stage. A liquid layer of carbon dioxide is formed on the surface of the substrate W.

The controller 50 opens the valve 353, and drives the rotating mechanism 372 to rotate the table 39, when carbon dioxide exists in liquid form, that is, in a non-supercritical state where the following conditions 1) and 2) are maintained.

1) The temperature and pressure are higher than a temperature of $-56.6°$ C. and a pressure of 5.1 atmospheres which define the triple point of carbon dioxide.

2) The temperature and pressure, which are lower than a temperature of $31.1°$ C. and a pressure of 72.8 atmospheres (7.38 MPa) respectively, do not reach a supercritical state.

Thus, the liquid carbon dioxide lc and the IPA liquid ds serving as the replacement liquid both present on the surface of the substrate W flow toward the outer periphery of the substrate W by centrifugal force resulting from the rotation of the substrate W. Then, the IPA liquid ds and the liquid carbon dioxide lc flow down onto the bottom surface of the dryer chamber 31 (or the upper surface of the bottom wall 316), and are drained through the drain pipes 351 to the outside of the dryer chamber 31. Rotating the substrate W achieves efficient replacement of the IPA liquid ds with the liquid carbon dioxide lc.

The liquid carbon dioxide lc supplied through the first inlet pipe 40 into the dryer chamber 31 is supplied uniformly onto the surface of the substrate W by the fluid dispersing mechanism 38. The liquid carbon dioxide lc easily enters gaps in the pattern formed on the surface of the substrate W because the surface tension of the liquid carbon dioxide lc is less than that of the IPA liquid ds. Such supply of the liquid carbon dioxide is continues until a lapse of a predetermined period of time so that the IPA liquid ds on the surface of the substrate W is completely replaced with the liquid carbon dioxide lc.

After a lapse of the predetermined period of time, the valve 323 and the valve 353 are closed to stop the supply of carbon dioxide into the dryer chamber 31. The non-supercritical state is maintained because the dryer chamber 31 is hermetically closed.

Figure 9:
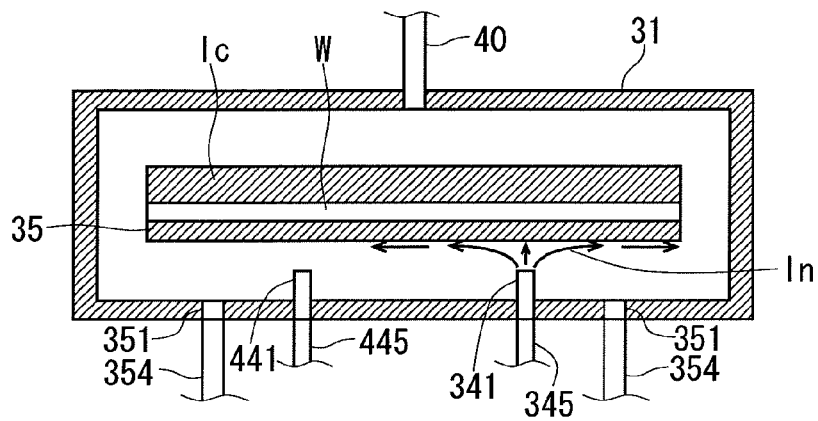
Figure 10:
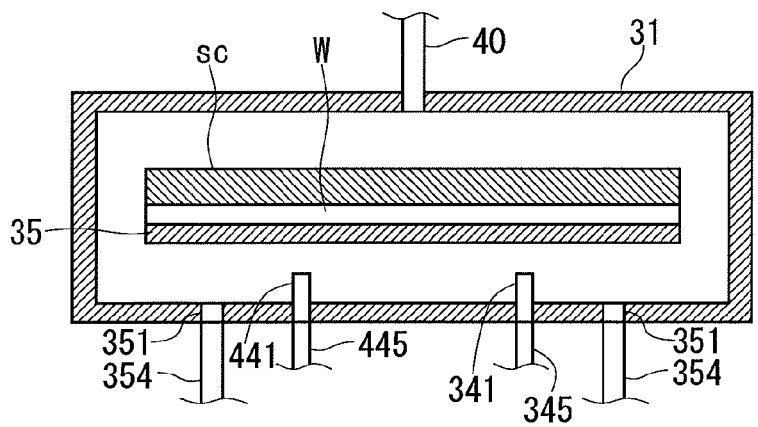

Subsequently, the valve 343 is opened to supply liquid nitrogen ln into the dryer chamber 31 (in Step S5 with reference to FIG. 9). At this time, the valve 353 is opened while the degree of opening of the valve 353 is adjusted so that the pressure in the dryer chamber 31 remains constant.

The liquid nitrogen n supplied through the second inlet pipe 341 is blown directly onto the bottom surface of the table 39. This rapidly decreases the temperature of the table 39 to cool down the substrate W held on the table 39. In other words, the table 39 cools down the substrate W using the entire surface thereof contacting the substrate W, as does a cool plate.

The pressure is held constant at 5.1 atmospheres or higher, and the temperature decreases. This causes the liquid carbon dioxide lc on the surface of the substrate W to solidify (with reference to FIG. 10). Specifically, with reference to FIG. 4, the temperature and pressure change along a solid line connecting a point indicating a state (A) and a point indicating a state (B), and a phase transition from the liquid carbon dioxide lc to solid carbon dioxide sc occurs when the temperature in the dryer chamber 31 decreases to below a predetermined temperature. The predetermined temperature is a temperature determined based on a melting curve representing a relationship between pressure and temperature at which a liquid phase and a solid phase coexist at the pressure in the dryer chamber 31. In this manner, liquid nitrogen serving as a refrigerant is supplied directly into the dryer chamber 31 to solidify carbon dioxide according to the first preferred embodiment. Thus, heat is removed from the substrate W through the surface of the table 39 contacting the substrate W. This efficiently cools down the substrate W to solidify the liquid carbon dioxide lc. In the first preferred embodiment, the part for supplying liquid nitrogen corresponds to a solidifying part for solidifying carbon dioxide. However, the solidifying part may use a refrigerant in the form of a gas and be configured to blow the refrigerant gas directly onto the surface of the substrate W without using the table 39. The temperature of the supplied refrigerant, whether in liquid form or in gaseous form, is required only to be lower than the solidification temperature of carbon dioxide at the pressure in the dryer chamber 31.

In this manner, the DIW (dw) serving as the rinsing liquid and having a solidification temperature much higher than that of carbon dioxide is replaced with the replacement liquid such as the IPA liquid ds having a solidification temperature lower than that of the DIW (dw) for the purpose of solidifying carbon dioxide according to the first preferred embodiment. This prevents the rinsing liquid, e.g. the DIW (dw), remaining on the surface of the substrate W from solidifying before carbon dioxide solidifies. Also, when the solidification temperature of the replacement liquid, e.g. the IPA liquid ds, is not higher than −56.6° C. that is the solidification temperature of carbon dioxide, the replacement liquid is prevented from solidifying before carbon dioxide solidifies.

After the surface of the substrate W is covered with the solid carbon dioxide sc in this manner, the valve 343 is closed, and the valve 353 is fully opened. This causes the pressure in the dryer chamber 31 to fall to a pressure of one atmosphere that is atmospheric pressure (in Step S6). At this time, the temperature in the dryer chamber 31 is further lowered because of adiabatic expansion. Specifically, the temperature and pressure change along a solid line connecting the point indicating the state (B) and a point indicating a state (C) with reference to FIG. 4.

Figure 11:
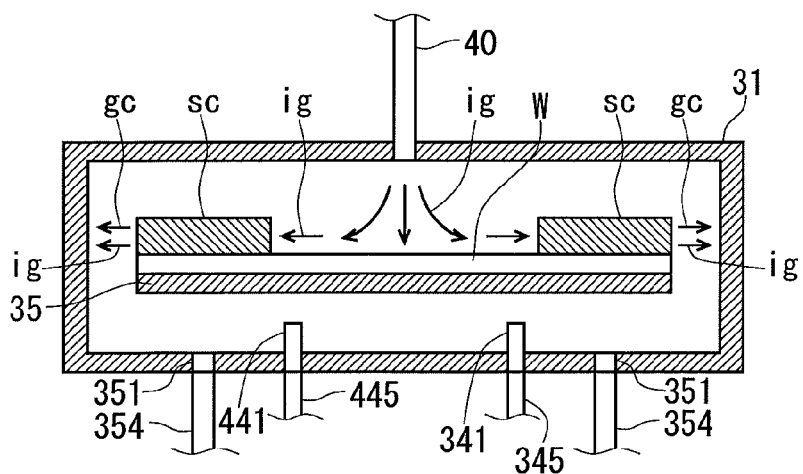

When the pressure in the dryer chamber 31 reaches atmospheric pressure, the valve 333 is opened to introduce gaseous nitrogen ig at room temperature through the first inlet pipe 40 into the dryer chamber 31 (in Step S7 with reference to FIG. 11). The temperature in the dryer chamber 31 is lower than the temperature of the gaseous nitrogen ig, and the valve 353 is left open. For this reason, the supply of the gaseous nitrogen ig into the dryer chamber 31 raises the temperature of the atmosphere in the dryer chamber 31, with the pressure in the dryer chamber 31 held at atmospheric pressure. Specifically, the temperature changes along a solid line connecting the point indicating the state (C) and a point indicating a state (D) with reference to FIG. 4. At this time, when the temperature in the dryer chamber 31 reaches −78.5° C. or higher, the solid carbon dioxide sc sublimates to make a phase transition to the gaseous carbon dioxide gc. The temperature at which the sublimation starts is a temperature determined based on a sublimation curve representing a relationship between pressure and temperature at which a solid phase and a vapor phase coexist at the pressure in the dryer chamber 31. There remains no liquid on the surface of the substrate W because the gaseous carbon dioxide gc is diffused from the surface of the substrate W into the atmosphere.

In this manner, the liquid carbon dioxide lc penetrating the gaps in the pattern of the substrate W is changed to a solid state by cooling, and then makes a phase transition to a gaseous state. Thus, carbon dioxide does not change to a liquid state before changing to the gaseous state. This prevents the production of capillary force peculiar to liquid to prevent the collapse of protruding portions of the pattern formed on the substrate W. As compared with a drying technique using a supercritical fluid which does not change to a liquid state before changing to a gaseous state in a similar manner, the drying process according to the first preferred embodiment is performed in a low-pressure atmosphere (environment). Thus, the first preferred embodiment reduces apparatus costs, as compared with facilities for achieving a supercritical state which requires a high-pressure environment. Additionally, the first preferred embodiment reduces processing time because there is no need to wait until a high-pressure environment is provided.

When the temperature of the substrate W is low, there is a difference in temperature between the substrate W and an atmosphere outside the dryer chamber 31. This gives rise to apprehension that dew condensation occurs on the surface of the substrate W when the substrate W is transported out of the dryer chamber 31 for a subsequent step. To prevent this, the valve 443 is opened to blow gaseous nitrogen hg warmed by the heater 444 through the third inlet pipe 441 directly onto the bottom surface of the table 39 (with reference to FIG. 12). These mechanisms for supplying the warmed gaseous nitrogen hg function as a temperature adjusting part. Heat transferred from the gaseous nitrogen hg through the table 39 to the substrate W raises the temperature of the substrate W to prevent dew condensation from occurring on the surface of the substrate W.

As described hereinabove, for the purpose of removing liquid from the surface of the substrate W, the dryer unit 30 according to the first preferred embodiment temporarily covers the surface of the substrate W with the liquid carbon dioxide lc, and then decreases the temperature in the dryer chamber 31, thereby causing the liquid carbon dioxide lc to make a phase transition to the solid carbon dioxide sc. Then, the dryer unit 30 releases the pressure in the dryer chamber 31 to an atmospheric environment to decrease the pressure in the dryer chamber 31 to atmospheric pressure (a pressure of one atmosphere), and thereafter increases the temperature, thereby using the sublimation of the solid carbon dioxide sc to the gaseous carbon dioxide gc. Since the sublimation reaction from the solid state to the gaseous state is used, the material on the surface of the substrate W is vaporized without entering the liquid state. This prevents capillary force from acting on the gaps in the pattern of the substrate W to prevent the collapse of the pattern formed on the surface of the substrate W.

Also, as compared with a drying technique using a supercritical fluid which produces a similar effect, the drying process according to the first preferred embodiment may be performed in a low-pressure environment. Thus, the first preferred embodiment eliminates the need for facilities for achieving a high-pressure environment to reduces apparatus costs.

Additionally, the first preferred embodiment reduces processing time because there is no need to wait until a high-pressure state in which a supercritical state is reached is provided.

Second Preferred Embodiment

Next, a dryer unit 30b according to a second preferred embodiment of the present invention will be described with reference to FIGS. 13 and 14. Like reference numerals and characters are used in the second preferred embodiment to designate components identical with those of the first preferred embodiment described above, and only differences from the dryer unit 30 of the first preferred embodiment will be described. The sublimation material for use in the second preferred embodiment is carbon dioxide, as in the first preferred embodiment.

The liquid carbon dioxide lc covering the surface of the substrate W placed in the dryer chamber 31 according to the first preferred embodiment is solidified by cooling. According to the second preferred embodiment, the liquid carbon dioxide lc is solidified by decreasing the pressure in the dryer chamber 31 in an adiabatic state.

Figure 13:
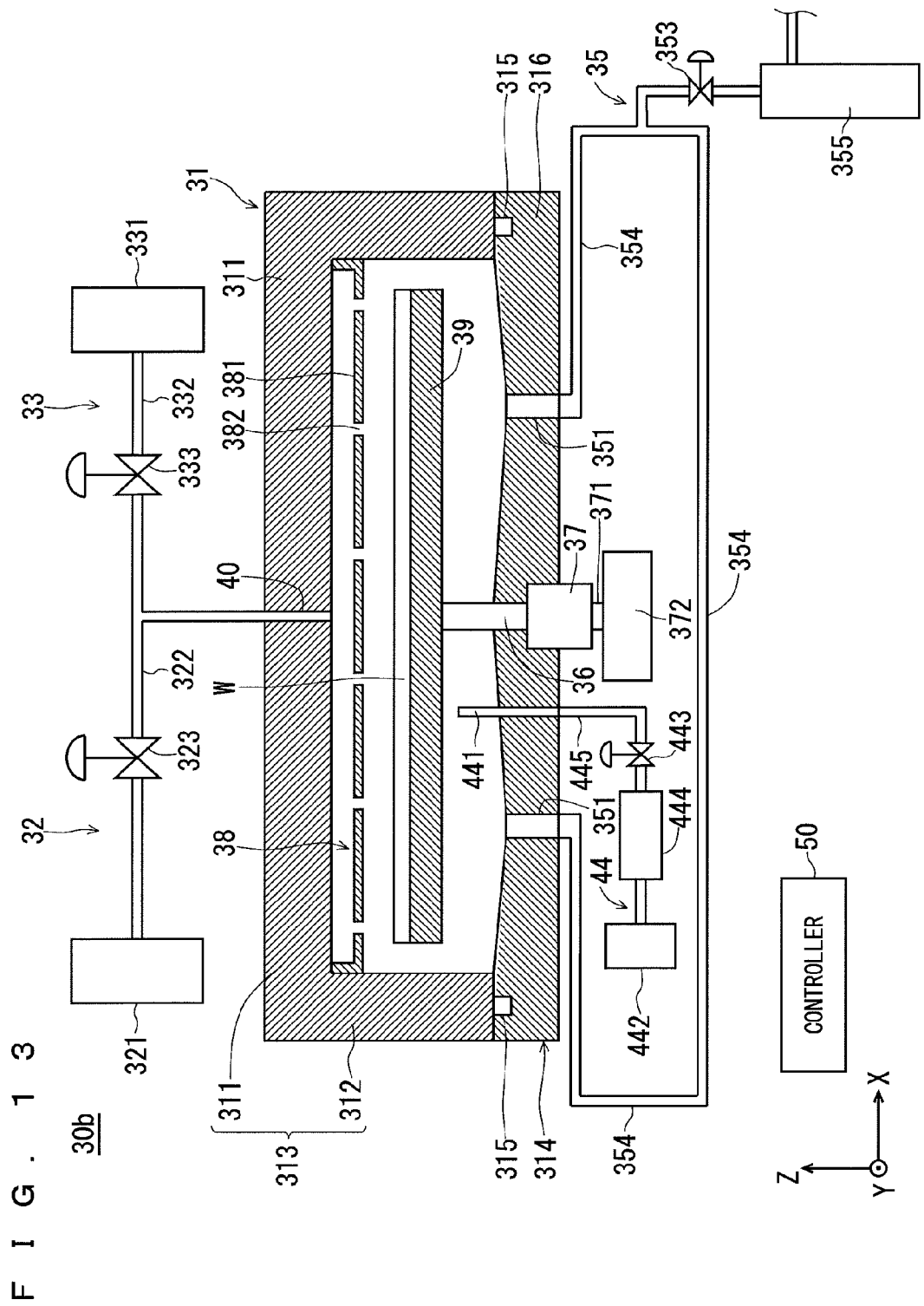
FIG. 13 is a sectional view of another dryer unit taken along a plane defined by X- and Z-axes according to the second preferred embodiment of the present invention.

As shown in FIG. 13, the dryer unit 30b according to the second preferred embodiment is configured such that the liquid nitrogen supply mechanism 34 provided in the first preferred embodiment is dispensed with. The solidifying part in the second preferred embodiment is the drain mechanism 35.

Figure 14:
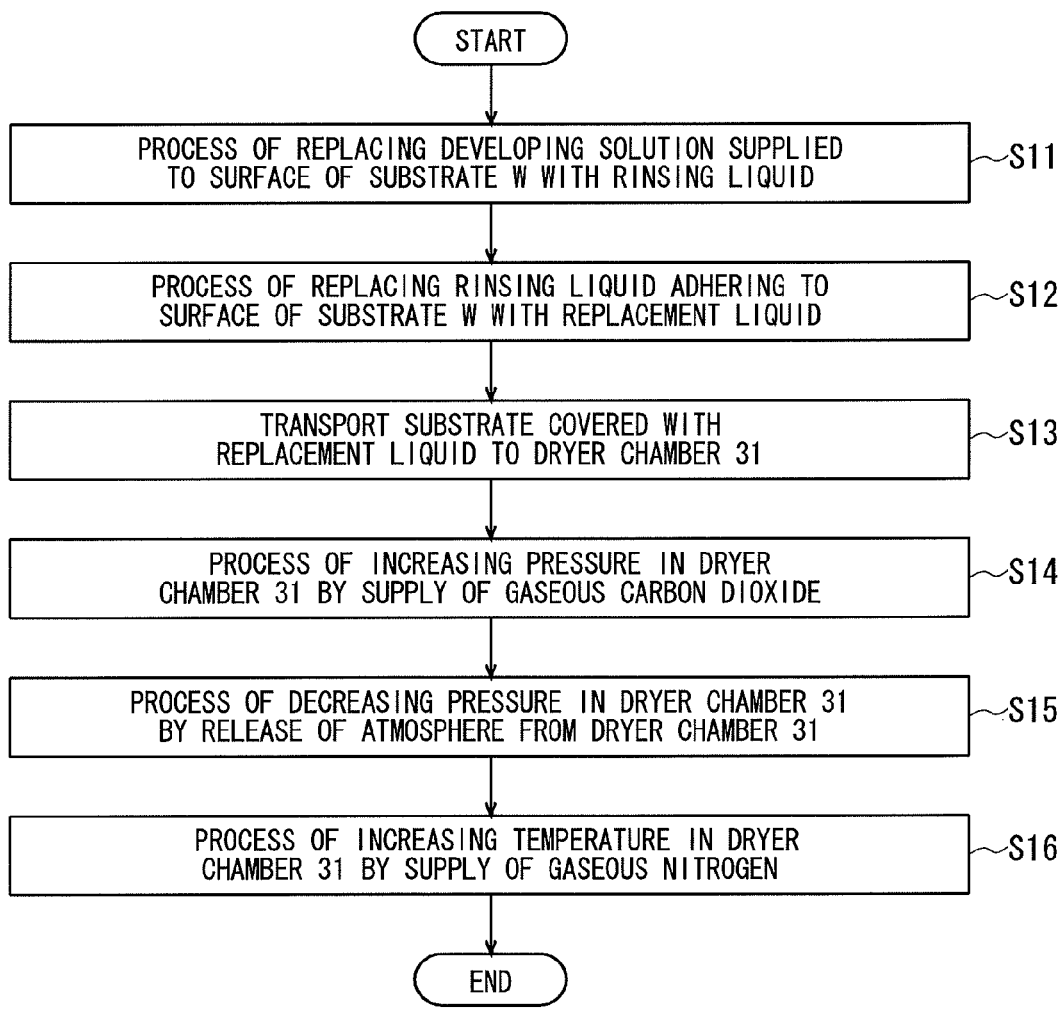
FIG. 14 is a flow diagram showing the procedure according to the second preferred embodiment of the present invention.

FIG. 14 is a flow diagram showing the procedure according to the second preferred embodiment of the present invention. As in the first preferred embodiment, the surface of the substrate W is covered with the liquid carbon dioxide lc. In the second preferred embodiment, the valve 353 is opened (in Step S15) after a lapse of a predetermined period of time since the covering of the surface of the substrate W with the liquid carbon dioxide lc. This decreases the pressure in the dryer chamber 31 to adiabatically expand the atmosphere in the dryer chamber 31, thereby decreasing the temperature. Thus, the temperature of the liquid carbon dioxide lc covering the surface of the substrate W decreases, which in turn solidifies the liquid carbon dioxide lc. In other words, the temperature and pressure change as represented by a solid line connecting the point indicating the state (A) and the point indicating the state (C) with reference to FIG. 4, to thereby cause carbon dioxide to make a phase transition from the liquid state to the solid state. At this time, the degree of opening of the valve 353 is adjusted so that the temperature and pressure do not make a phase transition from the liquid carbon dioxide lc to the gaseous carbon dioxide gc, i.e., so that the transition to the state (C) is made through a path lying above the triple point in the phase diagram of FIG. 4. The pressure in the dryer chamber 31 is finally decreased to atmospheric pressure, i.e., a pressure of one atmosphere. Then, gaseous nitrogen is supplied into the dryer chamber 31 (in Step S16), as in the first preferred embodiment, to sublimate the solid carbon dioxide sc to the gaseous carbon dioxide gc, thereby removing liquid (IPA liquid) from the surface of the substrate W. In other words, the temperature changes along the solid line connecting the point indicating the state (C) and the point indicating the state (D).

For convenience of illustration, the state (C) in the first preferred embodiment and the state (C) in the second preferred embodiment are indicated by the same point with reference to FIG. 4. However, the state (C) in the first preferred embodiment and the state (C) in the second preferred embodiment may be indicated by different points so far as these points lie on the line indicating one atmosphere in a region of the solid phase.

In this manner, the liquid nitrogen supply mechanism 34 is not required in the second preferred embodiment. Thus, the second preferred embodiment is capable of removing liquid from the surface of the substrate W by using simplified facilities, as compared with the first preferred embodiment. Additionally, the second preferred embodiment facilitates the control of the valve for solidifying carbon dioxide because it is necessary only to adjust the degree of opening of the valve 353.

As described hereinabove, the dryer unit 30b according to the second preferred embodiment performs the processes of covering the surface of the substrate W with the liquid carbon dioxide lc and decreasing the pressure in the dryer chamber 31, thereby causing the phase transition from the liquid carbon dioxide lc to the solid carbon dioxide sc. The second preferred embodiment produces effects similar to those of the first preferred embodiment, and also simplifies the construction and control of the apparatus.

<Modifications>

The present invention is not limited to the first and second preferred embodiments described above. For example, the dryer units 30 and 30b are used for the drying process subsequent to the developing process in the first and second preferred embodiments described above. The present invention, however, is not limited to such forms. When there arises a need to dry the surface of the substrate W subjected to a wet process, the substrate processing technique according to the present invention may be used.

An arrangement as a compromise between the first and second preferred embodiments may be used in which both of the temperature and pressure in the dryer chamber 31 (in general, a process chamber) are changed (specifically, using both cooling and pressure decrease) to sublimate solidified carbon dioxide, thereby removing carbon dioxide from the surface of the substrate.

Although the point indicating the state (C) lies on the line indicating one atmosphere, the state (C) need not correspond to one atmosphere so far as the state (C) corresponds to a pressure lower than that at the triple point and lies in a solid phase region. However, it is more preferable that the point indicating the state (C) lies on the line indicating one atmosphere because the pressure is easily controlled.

In the first and second preferred embodiments, carbon dioxide is used as the sublimation material. However, other materials which have a triple point (the temperature and pressure at which solid, liquid and vapor phases coexist) with a pressure of one atmosphere or higher may be used as the sublimation material. Also, other inert gases may be used in place of nitrogen for supply to the dryer chamber 31.

Although the second nitrogen supply mechanism 44 is provided in the first and second preferred embodiments, the present invention is not limited to such an arrangement. The second nitrogen supply mechanism 44 need not necessarily be provided. The first nitrogen supply mechanism 33 may be provided with a heater and configured for dual purpose so that supply of warmed nitrogen and supply of room-temperature nitrogen are selected. With such an arrangement, the first nitrogen supply mechanism 33 has the function of the second nitrogen supply mechanism 44.

While the invention has been described in detail, the foregoing description is in all aspects illustrative and not restrictive. It is understood that numerous other modifications and variations can be devised without departing from the scope of the invention.

What is claimed is:

1. A method of processing a substrate to remove a first liquid adhering to the substrate, said method comprising the steps of:
   (a) adjusting an atmosphere surrounding said substrate that is received in a process chamber and has said first liquid adhering thereto to an atmosphere having temperature and pressure higher than the temperature and pressure of a predetermined material at the triple point thereof;
   (b) supplying a second liquid made of said predetermined material to said substrate;
   (c) solidifying said predetermined material on said substrate; and
   (d) changing at least one of the temperature and pressure in said process chamber to sublimate the solidified predetermined material, thereby removing said predetermined material from said substrate, wherein
   said step (b) supplies said second liquid to said substrate in a state where the atmosphere surrounding said substrate is adjusted to an atmosphere having a temperature and a pressure higher than the temperature and pressure of said predetermined material at the triple point thereof in said step (a),
   said step (a) supplies a gas of said predetermined material to said process chamber hermetically closed to adjust the atmosphere surrounding said substrate to an atmosphere having a temperature and a pressure higher than the temperature and pressure of said predetermined material at the triple point thereof, and
   said step (b) is started by continuously supplying the gas of said predetermined material, which is supplied in said step (a), after the atmosphere surrounding said substrate is adjusted to an atmosphere having temperature and pressure higher than the temperature and pressure of said predetermined material at the triple point thereof such that the gas of said predetermined material to liquefy and adhere to said substrate as a liquid phase.

2. The method according to claim 1, wherein:
   a solidification temperature of said first liquid is lower than the temperature of said predetermined material at the triple point thereof.

3. The method according to claim 2, further comprising the step of:
   (h) cleaning said substrate by using a rinsing liquid before said step (a), wherein:
   said first liquid is a replacement liquid used for replacement of said rinsing liquid left on said substrate after said step (h), and
   a solidification temperature of said rinsing liquid is higher than the temperature of said predetermined material at the triple point thereof.

4. The method according to claim 1, wherein:
   said step (c) cools said predetermined material on said substrate to a temperature lower than a solidification temperature of said predetermined material.

5. The method according to claim 4, wherein:
   said step (c) supplies a fluid having a temperature lower than the solidification temperature of said predetermined material to a front surface or a rear surface of said substrate.

6. The method according to claim 4, further comprising the step of:
   (e) after said step (c), discharging the atmosphere surrounding said substrate having a pressure higher than the pressure of said predetermined material at the triple point thereof to the outside of said process chamber to decrease the pressure of said process chamber.

7. The method according to claim 6, wherein:
   said step (d) raises the temperature in the atmosphere surrounding said substrate after said step (e).

8. The method according to claim 7, further comprising the step of:
   (f) after said step (d), raising the temperature in the atmosphere surrounding said substrate to an external temperature of said process chamber.

9. The method according to claim 1, wherein:
   said step (c) discharges the atmosphere surrounding said substrate having the temperature and pressure higher than the temperature and pressure of said predetermined material at the triple point thereof to the outside of said process chamber to decrease the pressure in the atmosphere surrounding said substrate.

10. The method according to claim 9, wherein:
    said step (d) raises the temperature in the atmosphere surrounding said substrate.

11. The method according to claim 10, further comprising the step of:
    (g) raising the temperature in the atmosphere surrounding said substrate to the external temperature of said process chamber.

12. The method according to claim 1, wherein:
said predetermined material comprises a material having a pressure of one atmosphere or higher at the triple point thereof.
13. The method according to claim 12, wherein:
said predetermined material comprises carbon dioxide.

* * * * *